(12) United States Patent
Reinmuth et al.

(10) Patent No.: US 10,584,029 B2
(45) Date of Patent: Mar. 10, 2020

(54) METHOD FOR PRODUCING THIN MEMS CHIPS ON SOI SUBSTRATE AND MICROMECHANICAL COMPONENT

(71) Applicant: Robert Bosch GmbH, Stuttgart (DE)

(72) Inventors: Jochen Reinmuth, Reutlingen (DE); Burkhard Kuhlmann, Reutlingen (DE); Holger Hoefer, Juelich (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 16/055,895

(22) Filed: Aug. 6, 2018

(65) Prior Publication Data
US 2019/0039885 A1 Feb. 7, 2019

(30) Foreign Application Priority Data
Aug. 7, 2017 (DE) .................. 10 2017 213 636

(51) Int. Cl.
*H01L 21/00* (2006.01)
*B81C 1/00* (2006.01)
*H01L 21/02* (2006.01)

(52) U.S. Cl.
CPC ........ *B81C 1/00888* (2013.01); *B81C 1/0088* (2013.01); *B81C 1/00182* (2013.01); *B81C 1/00261* (2013.01); *H01L 21/02002* (2013.01); *B81C 2203/0118* (2013.01)

(58) Field of Classification Search
CPC ........... H01L 21/02002; B81C 1/00888; B81C 1/00182; B81C 1/00261; B81C 1/0088; B81C 2203/0118; B81C 2203/0792
See application file for complete search history.

(56) References Cited

U.S. PATENT DOCUMENTS

| | | | |
|---|---|---|---|
| 2006/0237806 A1* | 10/2006 | Martin | B81C 1/00182 257/415 |
| 2013/0175643 A1 | 7/2013 | Berthelot et al. | |
| 2017/0030788 A1* | 2/2017 | Boysel | G01L 9/0073 |

FOREIGN PATENT DOCUMENTS

| | | |
|---|---|---|
| DE | 102009002485 A1 | 10/2010 |
| DE | 102012210052 A1 | 12/2013 |
| DE | 10350036 B4 | 1/2014 |
| DE | 102013217726 A1 | 3/2015 |
| DE | 102014202801 A1 | 8/2015 |
| DE | 102016216207 A1 | 3/2018 |

* cited by examiner

*Primary Examiner* — Victor A Mandala
*Assistant Examiner* — Colleen E Snow
(74) *Attorney, Agent, or Firm* — Norton Rose Fulbright US LLP; Gerard Messina

(57) ABSTRACT

A method for producing thin MEMS chips on SOI substrate including: providing an SOI substrate having a silicon layer on a front side and having an oxide intermediate layer, producing a layer structure on the front side of the SOI substrate and producing a MEMS structure from this layer structure, capping the MEMS structure and producing a cavity, and etching a back side of the SOI substrate down to the oxide intermediate layer. Also described is a micromechanical component having a substrate, a MEMS layer structure having a MEMS structure in a cavity and a cap element, the MEMS structure and its cavity being enclosed by the substrate underneath and the cap element above, the substrate being made of polycrystalline silicon.

13 Claims, 8 Drawing Sheets

METHOD FOR PRODUCING THIN MEMS CHIPS ON SOI SUBSTRATE AND MICROMECHANICAL COMPONENT

RELATED APPLICATION INFORMATION

The present application claims priority to and the benefit of German patent application no. 10 2017 213 636.7, which was filed in Germany on Aug. 7, 2018, the disclosure which is incorporated herein by reference.

FIELD OF THE INVENTION

The present invention relates to a method for producing thin MEMS chips on SOI substrate and to a micromechanical component.

BACKGROUND INFORMATION

Patent document DE102009002485 discusses a method of how thin MEMS chips may be produced. The document discusses how particularly thin caps may be applied onto an existing MEMS substrate.

Patent document DE000010350036B4 discusses a method that makes it possible to produce very thin chips without back-thinning. For this purpose, buried cavities are created in a substrate. Semiconductor component are produced on the substrate. Trenches extending to the buried cavities are produced by separation etching, and the now very thin semiconductor component are thereby separated. Usually, cavities are arranged in such a way that following the creation of the separation trenches the chips are still held by a small web. If the chips are picked off the substrate, this web is broken mechanically. The creation of the buried cavities is very painstaking and expensive. The cavities also cause limitations in process control with respect to stability and thermal coupling. Moreover, this method is not suitable for MEMS sensors having sensitive free-standing MEMS structures (acceleration and rotation-rate sensors) since vibrations are produced in the MEMS component when tearing off the small webs, which can destroy the movable structures of the MEMS component.

As an alternative for producing thin semiconductor components, methods were further developed in which essentially the substrate is ground down from behind until only very thin wafers remain. Such methods are of course also very painstaking, but have the essential advantage that the semiconductor substrate and the semiconductor production process do not have to be changed.

Such a process is not suitable for producing thin MEMS components such as acceleration sensors or rotation-rate sensors. When grinding the substrate, vibrations are coupled into the substrate, which cause the freely movable structures of the MEMS sensors to break. Furthermore, a great pressure is exerted on the substrate when grinding the substrate and removing material. The MEMS components have a cavity in which the exposed MEMS structures are situated. This cavity would be squeezed together by the applied pressure, and the MEMS structures would be thereby destroyed. Even if the thickness is chosen to be so thick that the cavity would not be squeezed together completely in the grinding process, the cavity would be bent inward and the grinding process would not be able to produce an even surface.

Processes without mechanical removal such as wet etching or plasma etching cannot be considered as alternatives since they have a highly inhomogeneous removal rate across the wafer and are therefore not suitable for producing very think chips having a precisely defined thickness.

SUMMARY OF THE INVENTION

It is an objective of the present invention to create a method for producing very thin MEMS chips having a cavity, as well as a thin micromechanical component.

The present invention relates to a method for producing thin MEMS chips on SOI substrate including the steps (tasks):
  (A) providing an SOI substrate having a silicon layer on a front side and having an oxide intermediate layer,
  (B) producing a layer structure on the front side of the SOI substrate and producing a MEMS structure from this layer structure,
  (C) capping the MEMS structure and producing a cavity, and
  (D) etching a back side of the SOI substrate down to the oxide intermediate layer.

One advantageous development of the production method of the present invention provides for capping the MEMS structure in step (C) using a cap wafer and subsequently, in a step (C1), processing the back side of the cap wafer using a grinding process, whereby the cap wafer is thinned, step (C1) occurring prior to step (D).

One advantageous development of the production method of the present invention provides capping the MEMS structure in step (C) using another SOI substrate having another oxide intermediate layer and subsequently, in a step (C2), etching a back side of the additional SOI substrate down to the additional oxide intermediate layer.

One advantageous development of the production method of the present invention provides for capping the MEMS structure in step (C) in that
  etching accesses are etched into the final polysilicon layer,
  the additional oxide layer is etched through the etching accesses and an exposed MEMS structure is produced and
  the etching accesses are closed by depositing another layer or by melting them shut.

One advantageous development of the production method of the present invention provides for providing, in step (A), an SOI substrate having a polysilicon layer on the front side.

One advantageous development of the production method of the present invention provides for providing, in step (A), an SOI substrate having a first structured oxide layer as the oxide intermediate layer.

One advantageous development of the production method of the present invention provides for providing, in step (A), an SOI substrate having a multilayered oxide intermediate layer, in particular having a first structured oxide layer and another thin oxide layer.

There is a provision to use an SOI substrate as base substrate for the MEMS process. A MEMS structure is applied on the new MEMS substrate and is capped. The substrate material is removed down to the oxide layer of the SOI material, the oxide layer acting as a stop layer. A non-mechanical removal is provided as removal method, at least for the final approx. 100 μm. No vibrations are produced in the process, which could destroy the free-standing MEMS elements, and the cavity is not compressed even during the removal. The disadvantage that the removal rate in methods such as plasma etching or etching in an etching gas or wet etching have a great variance is circumvented in that the oxide layer of the SOI substrate functions as a stop layer for the etching process.

The present invention further provides for using an SOI material having a structured or partially structured oxide intermediate layer. Using the structured SOI intermediate layer makes it possible to separate the individual components from one another at the same time as the substrate is back-thinned.

Advantageously, the method of the present invention makes it possible to produce very thin MEMS elements having a cavity or even sensitive movable structures. It is possible to produce much thinner MEMS chips than before.

The method is relatively simple and cost-effective. The thickness of the components is very well defined and the thickness variance is low. The method is insensitive to process fluctuations (e.g. etching rates). The method causes no mechanical vibrations that could destroy the MEMS components.

The method at the same time allows for a separation of the chips. The separation of the chips allows for much smaller spacings between the components than previously. Thin MEMS chips are also configured to be very small in terms of surface area. The space between the chips makes up an ever-increasing proportion of the wafer surface. If it is possible to reduce the space between the chips, the production costs may be reduced drastically.

The separation of the chips using an etching process such as plasma etching produces a chip edge that is quite free of defects and fissures. Fissures on the wafer edge may produce stress in the chip and result in an imbalance in the MEMS structures. This effect may be avoided by using the new separation method. The chips are consequently more robust in further processing.

The present invention also relates to a micromechanical component having a substrate, a MEMS layer structure having a MEMS structure in a cavity and a cap element, the MEMS structure and its cavity being enclosed by the substrate underneath and the cap element above, the substrate being made of polycrystalline silicon. A substrate made of polysilicon advantageously allows for the creation of a micromechanical component having particularly low mechanical stresses. Advantageously, the micromechanical component is very thin in comparison with hitherto known surface-micromechanically produced components.

One advantageous development of the micromechanical component of the present invention provides for the cap element to be made of polycrystalline silicon.

BRIEF DESCRIPTION OF THE DRAWINGS

FIG. 8B shows the etching of a back side of the SOI substrate having a structured sacrificial layer with the back side further etched.

FIG. 10 shows schematically the method of the present invention for producing thin MEMS chips on SOI substrate.

DETAILED DESCRIPTION

Figure 1A:
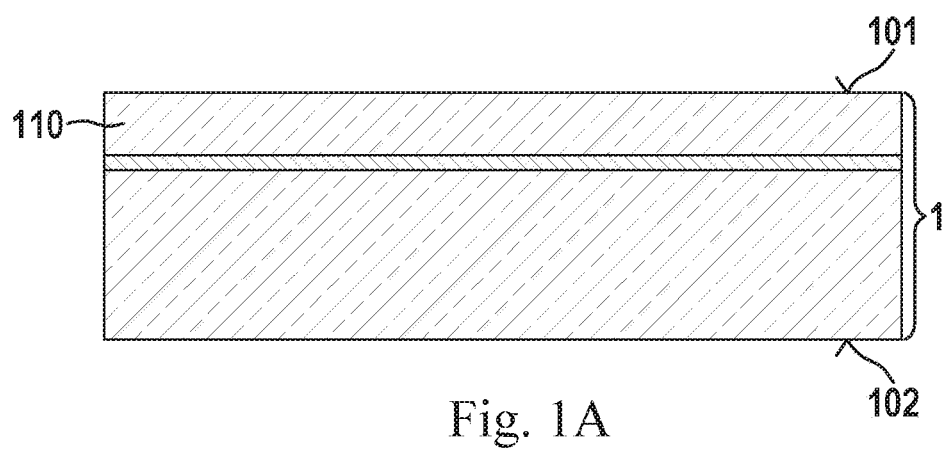
FIG. 1A shows the silicon layer, front side and back side of an SOI substrate.
Figure 1B:
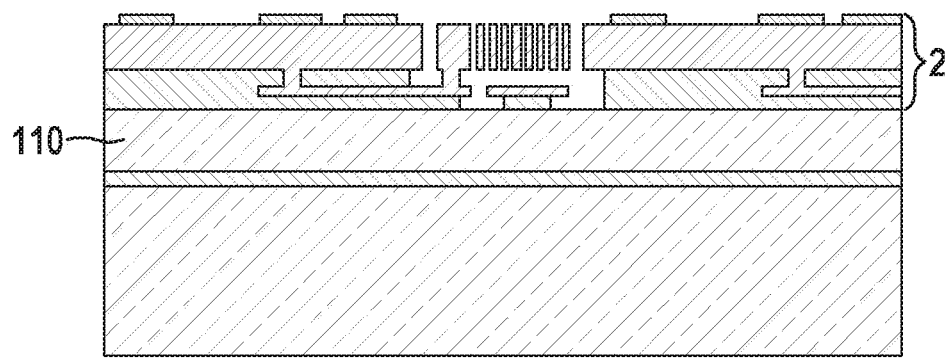
FIG. 1B shows the production of a MEMS structure on the SOI substrate with a silicon layer.
Figure 2:
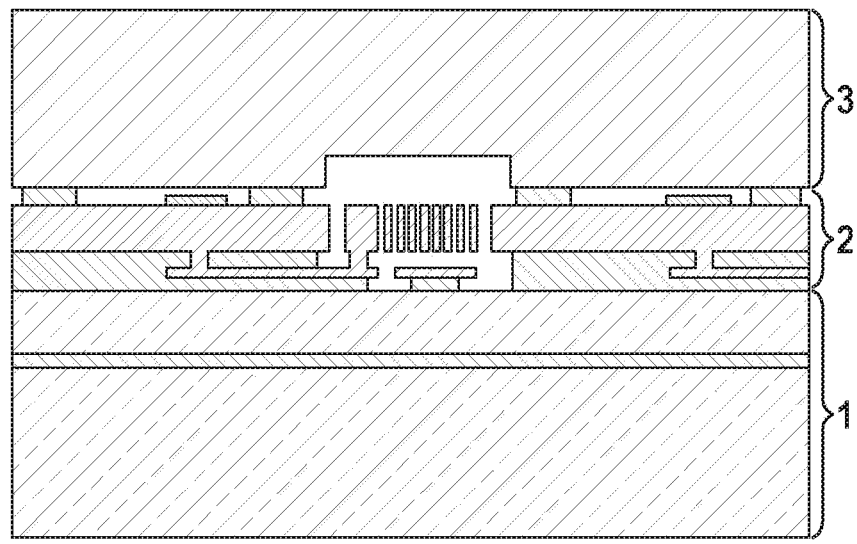
FIG. 2 shows the capping of the MEMS structure using a cap wafer.
Figure 3A:
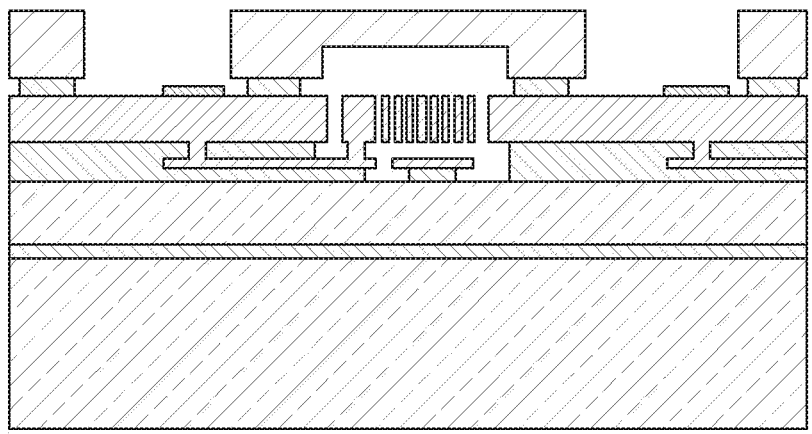
FIG. 3A shows the thinning of the cap wafer and the process of etching to expose the contact areas on the MEMS element.
Figure 3B:
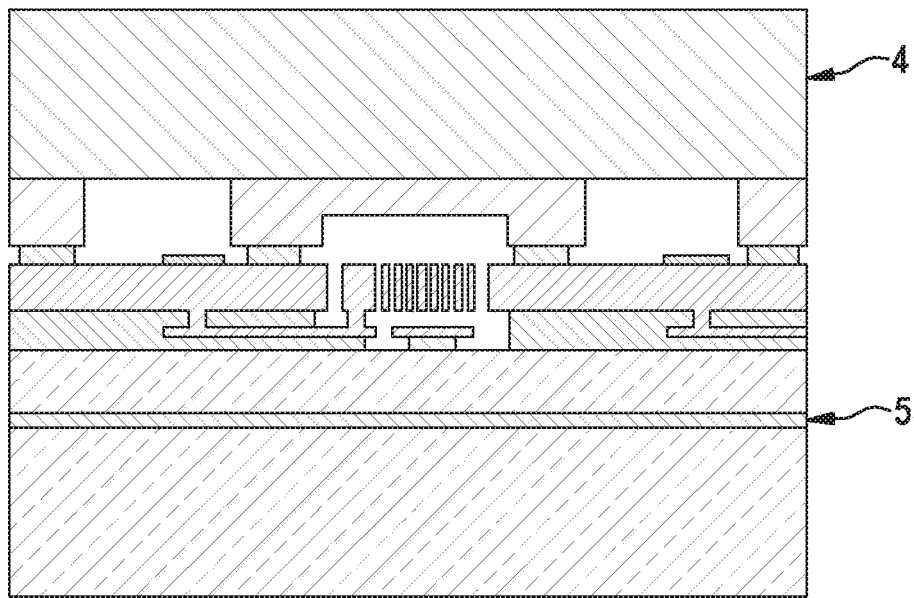
FIG. 3B shows the thinning of the cap wafer, showing carrier water and oxide intermediate layer of substrate, and the process of etching to expose the contact areas on the MEMS element and the application of a carrier film or a carrier wafer.
Figure 4A:
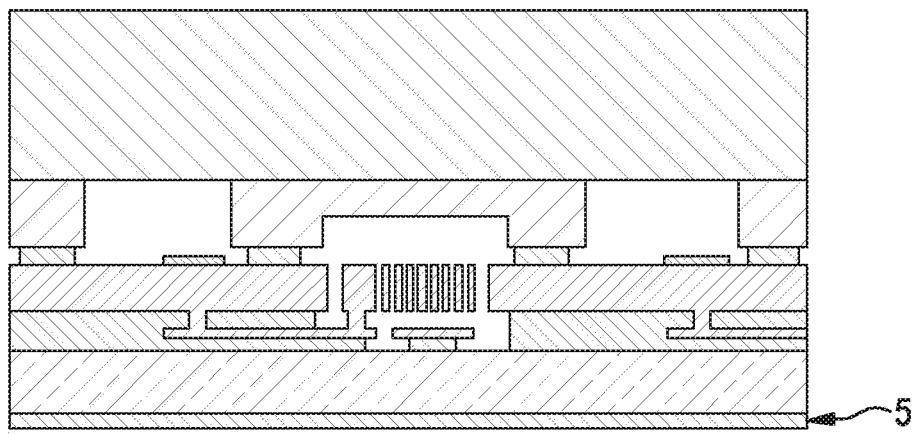
FIG. 4A shows the etching of a back side of the SOI substrate with an oxide intermediate layer.
Figure 4B:
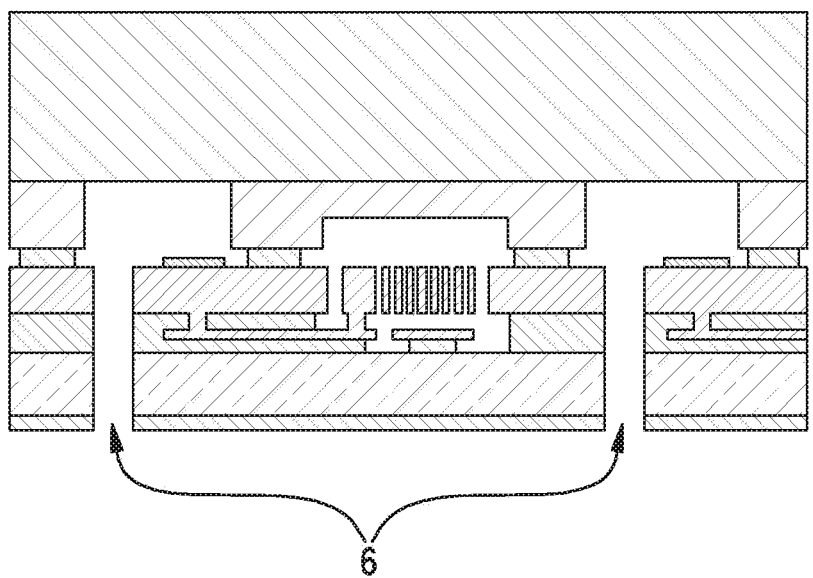
FIG. 4B shows the etching of a back side of the SOI substrate and the introduction of separating trenches.
Figure 5A:
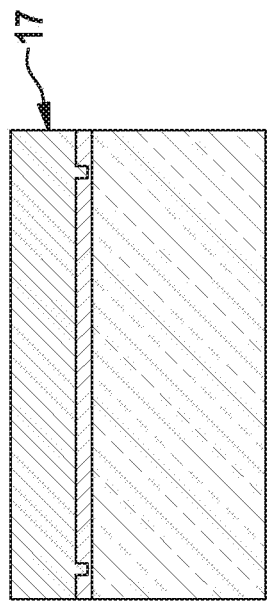
FIG. 5A shows the production of an SOI substrate having the first oxide polysilicon layer with monocrystalline Si wafer.
Figure 5C:
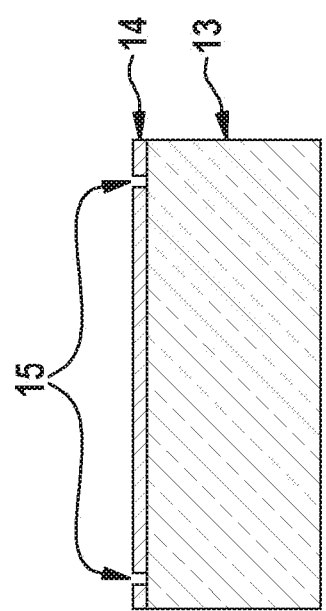
FIG. 5C shows the production of an SOI substrate having a thick polysilicon layer.
Figure 5B:
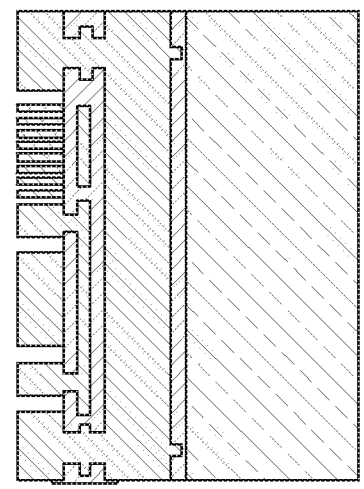
FIG. 5B shows the production of an SOI substrate having a further oxide layer.
Figure 5D:
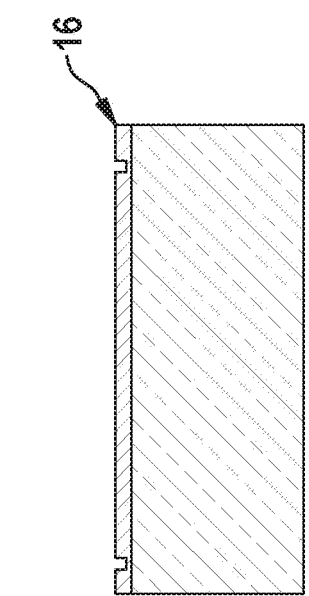
FIG. 5D shows the production of an SOI substrate having a thick polysilicon layer and the production of a MEMS structure on this SOI substrate.
Figure 9C:
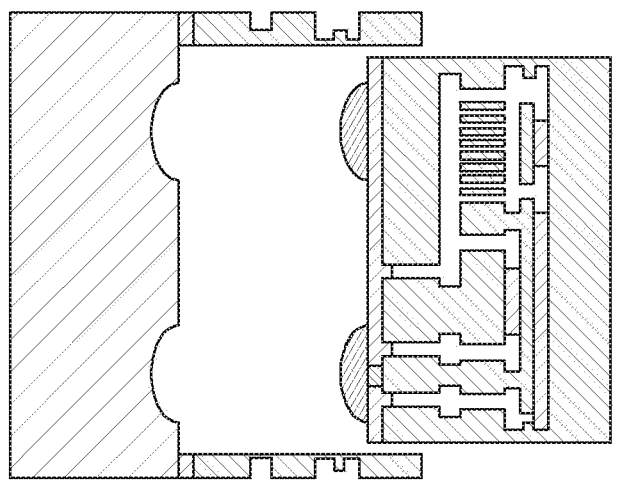
FIG. 9C shows the separation of MEMS by trench etching, with the chips being removed from the carrier after etching.
Figure 9B:
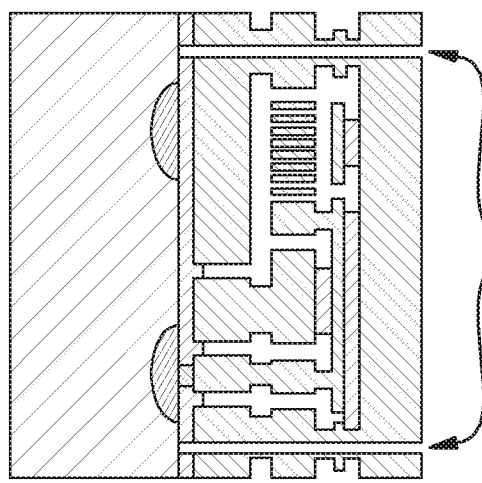
FIG. 9B shows the separation of MEMS by etched trenches.
Figure 9A:
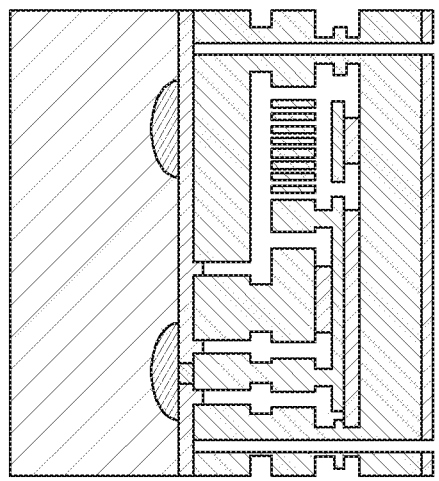
FIG. 9A shows the separation of MEMS by etched trenches.

First Exemplary Embodiment of the Method of the Present Invention for Producing Thin MEMS Chips on SOI Substrate A MEMS structure 2 is produced on an SOI wafer 1 using known production methods. For this purpose, a layer structure is produced on a front side 101 of the SOI wafer, that is, on silicon layer 110, from which the MEMS structure 2 is produced. The wafer is closed by a cap wafer 3. Before the SOI wafer is thinned, the cap wafer may be removed by a grinding process (FIG. 3 A). Optionally, contact surfaces are exposed or produced (FIG. 3 A). The wafer is applied with the cap side on a carrier wafer or a carrier film 4 (FIG. 3 B). Using an etching method, back side 102 of SOI substrate 1 is etched down to oxide intermediate layer 5 (FIG. 4 A). Optionally, it is possible to remove the oxide layer (FIG. 9 B). Advantageously, the wafer may be separated using a classic separation process such as a sawing process in that separation trenches 6 are introduced while the wafer is still held on the carrier wafer or carrier film (FIG. 4 B).

Second Exemplary Embodiment of the Method of the Present Invention Using a Cap Substrate as SOI Wafer Like the substrate material of the MEMS, the cap substrate may also be formed from an SOI wafer, and the back-thinning of the cap may be performed using a wet-etching process or a plasma-etching process with a stop on the intermediate oxide layer of the cap SOI wafer (not shown graphically here).

Figure 6A:
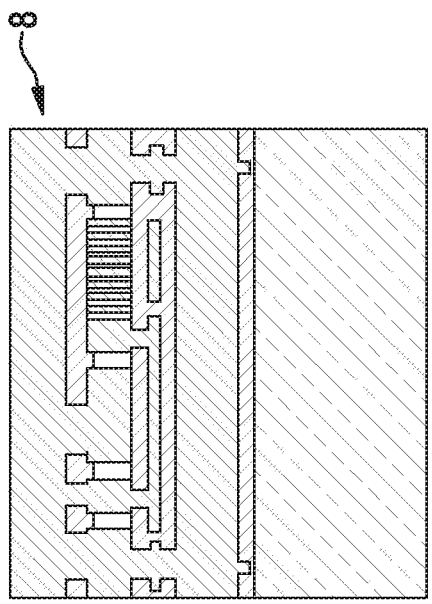
FIG. 6A shows the capping of the MEMS structure by deposition of a further oxide layer.
Figure 6B:
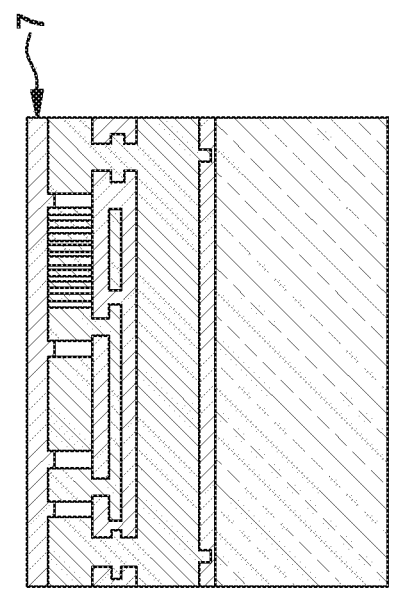
FIG. 6B shows the capping of the MEMS structure by deposition of an etched further oxide layer.
Figure 6C:
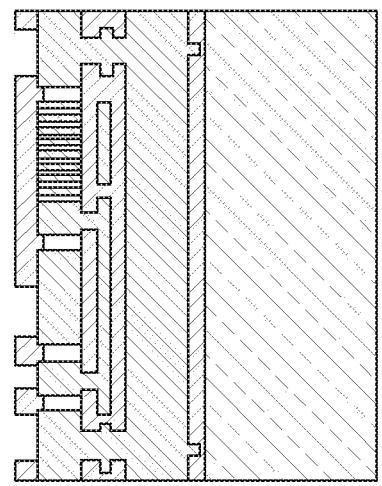
FIG. 6C shows the capping of the MEMS structure by deposition of a final polysilicon layer.
Figure 7C:
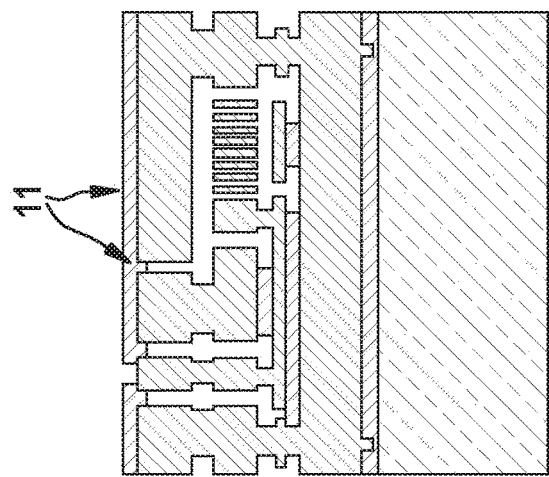
FIG. 7C shows the exposition of a MEMS structure and the reclosure of a capping by further layer deposition.
Figure 7D:
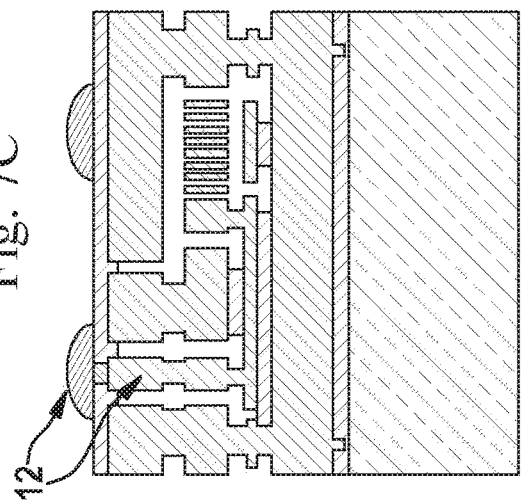
FIG. 7D shows the exposition of a MEMS structure and the reclosure of a capping by further layer deposition, showing electrical contact.
Figure 7A:
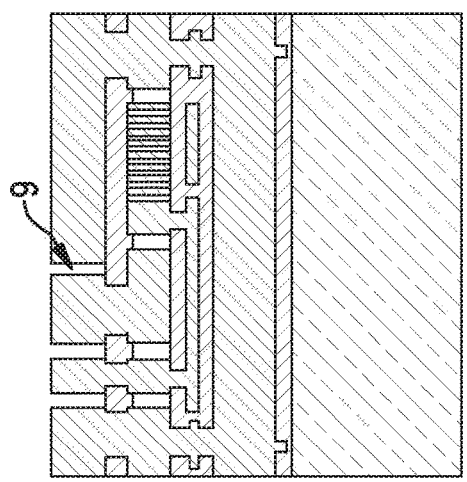
FIG. 7A shows the exposition of a MEMS structure and the reclosure of a capping by layer deposition, showing etching access openings.
Figure 7B:
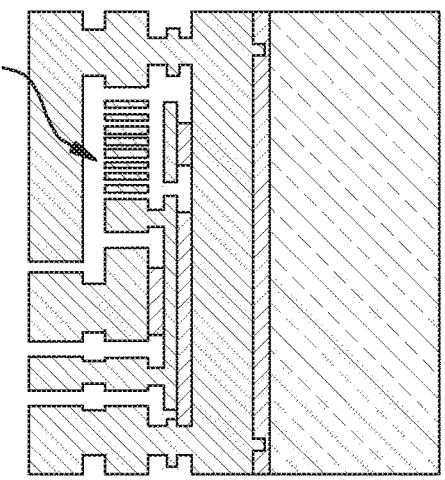
FIG. 7B shows the exposition of a MEMS structure and the reclosure of a capping by layer deposition, with a removed further oxide layer.

Third Exemplary Embodiment of the Method of the Present Invention Using Layer Deposition for Capping It is particularly advantageous if a layer deposition is used as capping method for the MEMS element. Polysilicon deposition is particularly advantageous. The MEMS elements are usually exposed by sacrificial layer etching using gaseous HF. It is therefore possible to deposit a further oxide layer 7 and a final polysilicon layer 8 on the final MEMS layer prior to the sacrificial layer etching (FIGS. 6 A through C). Via the access openings 9 etched into final polysilicon layer 8, it is then possible to remove the additional oxide layer 7, and exposed MEMS structures 10 may be created. The etching access openings may be closed by a further layer deposition 11 or by thermally melting the etching access openings shut (e.g. DE102014202801A1). Subsequently, electrical contacts 12 to the MEMS structure may be produced (FIGS. 7 A through D). The advantage of this method is that it produces a thin closing layer, which acts as a cap and does not necessitate back-thinning the cap wafer as in the first and second exemplary embodiments of the method described above.

Furthermore, it is advantageously possible in this process to produce, as shown in FIGS. 7 A through D, also the electrical access to the MEMS elements by way of producing the etching access holes and the subsequent closure.

Fourth Exemplary Embodiment of the Method of the Present Invention Using an SOI Wafer Having a Structured Oxide Layer In place of a classic SOI wafer having two monocrystalline silicon areas and an oxide layer in between, it is also possible to use an SOI wafer having a structured oxide layer. Subsequently, the MEMS production process is directed to the structured oxide layer. The oxide layer is broken in the areas between the individual chips. In the simplest variant or as described in variant 2, the MEMS wafer is capped and applied onto a film or carrier wafer. As in the basic variant, the SOI wafer is thinned down to the intermediate oxide layer. The oxide layer is used as a mask for the further structuring of the wafer. Advantageously, at least starting with the oxide layer, an etching method that produces perpendicular edges is used like a trench method. Using the trench method, the chips are separated by trenches 18 (FIGS. 9 A and B) and may be removed from the carrier after etching (FIG. 9 C).

Figure 8C:
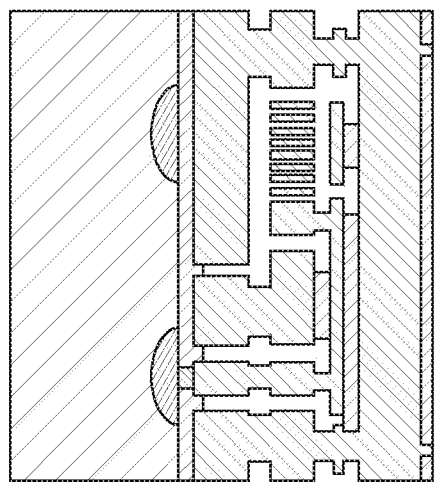
FIG. 8A shows the etching of a back side of the SOI substrate on the bottom, having a structured sacrificial layer.
FIG. 8B shows the etching of a back side of the SOI substrate having a structured sacrificial layer where the back side is etched away.
Figure 8B:
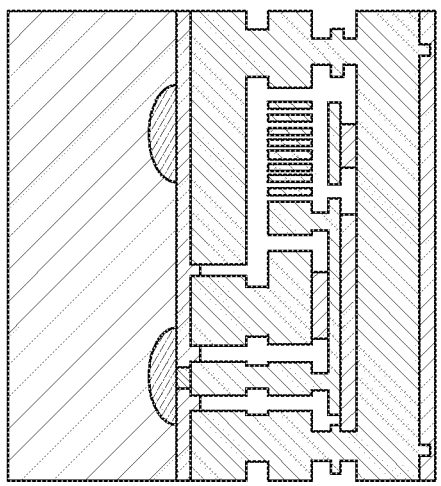
Figure 8A:
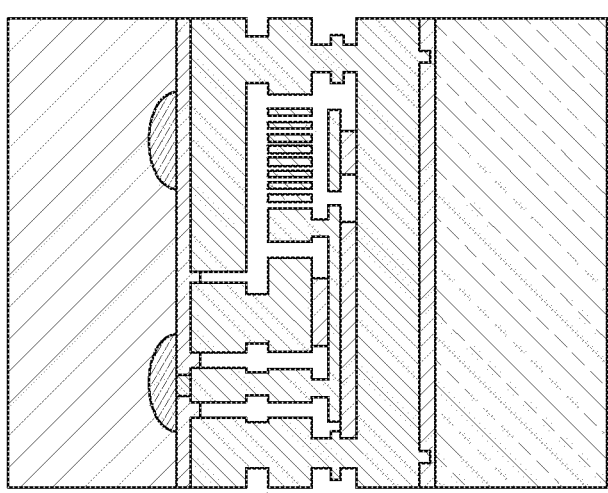

Fifth Exemplary Embodiment of the Method of the Present Invention Using an SOI Wafer Having a Structured Oxide Layer The oxide layer in the SOI wafer may also be built up from multiple layers of which at least one is structured or may have a thin and a thicker area, the thick area being structured. This makes it possible initially to remove the material very quickly down to the oxide layer using a not very perpendicularly etching removal process such as wet etching or pure plasma etching using SF6. Subsequently, it is possible to remove either the thin portion of the oxide layer by oxide etching down to the silicon layer underneath or to produce a structured surface on the silicon underneath by selective etching of one of the multiple layers. FIGS. 8 A through C show in exemplary fashion the etching of a back side 102 of an SOI substrate having a structured sacrificial layer. Subsequently, is is possible to produce etched trenches 18 using an etching method that produces perpendicular edges, in particular a trench method, and to separate the chips in this manner (FIG. 9 A through C). Due to the now very well defined remaining thickness and etch geometry, it is possible to use an etching method that is optimized in terms of costs and parameters. Since the separation of the chips is a self-adjusting process on the structured oxide layer, the separation may be very precise and cost-effective.

Sixth Exemplary Embodiment of the Method of the Present Invention Using an SOI Substrate Having a Polycrystalline Silicon Layer as the Uppermost Layer In place of a classic SOI wafer, which is produced via a direct bonding method of two wafers with an intermediate oxide layer, it is also possible to use a substrate having a polycrystalline silicon layer as uppermost layer. For this purpose, the present invention provides for taking a normal monocrystalline Si wafer 13 and for depositing or growing on it a first oxide layer 14. From this the first structured oxide layer 15 is produced (FIG. 5 A). Subsequently, another thin oxide layer 16 may be optionally grown or deposited as shown in FIG. 5 B. Then a thick polysilicon layer is deposited 17 (FIG. 5 C). It is advantageous to planarize the usually rough polysilicon surface. Using this new special substrate produced for this purpose, it is now possible to produce the thin MEMS sensor (FIG. 5 D). In this approach it is advantageous that the new substrate is more cost-effective to produce than the known production methods for SOI wafers. Furthermore it is very advantageous that it is now possible to use as substrate material for the thin MEMS sensor the same material as the MEMS function layer, which is usually also made of polycrystalline silicon. Furthermore, it is advantageous to combine this production method with a polycrystalline cap. If crystallographically identical material is used both as cap material, and therefore also as substrate material, and as functional layer, it is expected that the function layer no longer experiences any stress effects. In such approaches it is of course also advantageous that the substrate thickness below the MEMS and the cap thickness do not deviate greatly from each other so that the neutral fiber lies as much as possible in the function layer and thus in the MEMS structure. The difference between cap thickness and substrate thickness should therefore not exceed twice the thickness of the function layer.

FIG. 10 shows schematically the method of the present invention for producing thin MEMS chips on SOI substrate including the essential steps:

(A) providing an SOI substrate (1) having a silicon layer on a front side (101) and having an oxide intermediate layer (5), (B) producing a layer structure on the front side (101) of the SOI substrate (1) and producing a MEMS structure (2) from this layer structure, (C) capping the MEMS structure (2) and producing a cavity, and (D) etching a back side (102) of the SOI substrate down to the oxide intermediate layer (5).

The List of Reference Symbols is as follows:
1 SOI substrate
2 MEMS structure
3 Cap wafer
4 Carrier wafer or carrier film
5 Oxide intermediate layer
6 Separation trench
7 Further oxide layer
8 Final polysilicon layer
9 Etching access
10 Exposed MEMS structure
11 Further layer deposition
12 Electrical contact
13 Monocrystalline Si wafer
14 First oxide layer
15 First structured oxide layer
16 Further thin oxide layer
17 Thick polysilicon layer
18 Etched trench
101 Front side of the SOI substrate
102 Back side of the SOI substrate
110 Silicon layer of the SOI substrate

What is claimed is:

1. A method for producing a thin Micro-Electro-Mechanical System (MEMS) chip on a Silicon-on-Insulator (SOI) substrate, the method comprising:
    (A) providing an SOI substrate having a silicon layer on a front side and having an oxide intermediate layer;
    (B) producing a layer structure on the front side of the SOI substrate and producing a MEMS structure from this layer structure;
    (C) capping the MEMS structure and producing a cavity; and
    (D) etching a back side of the SOI substrate down to the oxide intermediate layer;
    wherein the MEMS structure is capped in (C) using another SOI substrate having another oxide intermediate layer and subsequently, in (C2), a back side of the additional SOI substrate is etched down to the additional oxide intermediate layer.

2. The method of claim 1, wherein the MEMS structure is capped in (C) using a cap wafer and subsequently, in (C1), a back side of the cap wafer is processed using a grinding process, whereby the cap wafer is thinned, (C1) occurring prior to (D).

3. The method of claim 1, wherein an SOI substrate having a polysilicon layer on the front side is provided in (A).

4. The method of claim 1, wherein an SOI substrate having a first structured oxide layer is provided in (A) as oxide intermediate layer.

5. The method of claim 1, wherein an SOI substrate having a multilayered oxide intermediate layer, in particular having a first structured oxide layer and another thin oxide layer is provided in (A).

6. The method of claim 1, wherein components are separated by a trench process that uses a first structured oxide layer as an etching mask.

7. A method for producing thin a Micro-Electro-Mechanical System (MEMS) chip on a Silicon-on-Insulator (SOI) substrate, the method comprising:
    (A) providing an SOI substrate having a silicon layer on a front side and having an oxide intermediate layer;
    (B) producing a layer structure on the front side of the SOI substrate and producing a MEMS structure from this layer structure;
    (C) capping the MEMS structure and producing a cavity; and
    (D) etching a back side of the SOI substrate down to the oxide intermediate layer;
    wherein the MEMS structure is capped in (C) wherein an additional oxide layer and a final polysilicon layer are deposited on the MEMS structure, wherein etching accesses are etched into the final polysilicon layer, wherein the additional oxide layer is etched through the etching accesses, and wherein an exposed MEMS structure is produced and the etching accesses are closed by depositing another layer or by melting the accesses shut.

8. The method of claim 7, wherein an SOI substrate having a polysilicon layer on the front side is provided in (A).

9. The method of claim 8, wherein the components are separated by a trench process that uses the first structured oxide layer as an etching mask.

10. The method of claim 7, wherein an SOI substrate having a first structured oxide layer is provided in (A) as oxide intermediate layer.

11. The method of claim 10, wherein the components are separated by a trench process that uses the first structured oxide layer as an etching mask.

12. The method of claim 7, wherein an SOI substrate having a multilayered oxide intermediate layer, in particular having a first structured oxide layer and another thin oxide layer is provided in (A).

13. The method of claim 12, wherein the components are separated by a trench process that uses the first structured oxide layer as an etching mask.

* * * * *